(12) United States Patent
Udagawa

(10) Patent No.: US 6,831,304 B2
(45) Date of Patent: Dec. 14, 2004

(54) P-N JUNCTION TYPE BORON PHOSPHIDE-BASED SEMICONDUCTOR LIGHT-EMITTING DEVICE AND PRODUCTION METHOD THEREOF

(75) Inventor: Takashi Udagawa, Saitama (JP)

(73) Assignee: Showa Denko Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/370,761

(22) Filed: Feb. 24, 2003

(65) Prior Publication Data

US 2003/0160253 A1 Aug. 28, 2003

Related U.S. Application Data

(60) Provisional application No. 60/367,702, filed on Mar. 28, 2002.

(30) Foreign Application Priority Data

Feb. 25, 2002 (JP) .................................... P2002-047457

(51) Int. Cl.$^7$ ............................................. H01L 29/22
(52) U.S. Cl. .......................... 257/94; 257/102; 257/79; 257/80; 257/82; 257/85; 257/96; 438/22; 438/46; 438/47
(58) Field of Search .......................... 257/94, 102, 79, 257/80, 82, 85, 96; 438/22, 46, 47

(56) References Cited

U.S. PATENT DOCUMENTS 5,929,466 A  * 7/1999 Ohba et al. ................. 257/103
6,069,021 A    5/2000 Terashima et al.
6,531,716 B2 * 3/2003 Udagawa ..................... 257/94
6,541,799 B2 * 4/2003 Udagawa ..................... 257/94

FOREIGN PATENT DOCUMENTS

| JP | 2-275682 | 11/1990 |
|----|----------|---------|
| JP | 2-288388 | 11/1990 |
| JP | 6-260680 | 9/1994  |

* cited by examiner

*Primary Examiner*—Tom Thomas
*Assistant Examiner*—Eugene Lee
(74) *Attorney, Agent, or Firm*—Sughrue Mion, PLLC

(57) ABSTRACT

A pn-junction-type semiconductor light-emitting device having a single-crystal silicon (Si) substrate of first conduction type; a first boron-phosphide-based semiconductor layer of first conduction type provided on the substrate; a light-emitting layer formed of a Group III-V semiconductor layer of first or second conduction type which is doped with an element belonging to Group IV of the periodic table provided on the first boron-phosphide-based semiconductor layer; and second boron-phosphide-based semiconductor layer of second conduction type formed of a boron-phosphide-based semiconductor layer of second conduction type containing a Group IV element provided on the light-emitting layer. The first boron-phosphide-based semiconductor layer, the light-emitting layer, and the second boron-phosphide-based semiconductor layer form a pn-junction-type hetero structure. In addition, the second conduction type is opposite the first conduction type. Also, disclosed is a method for producing the device.

12 Claims, 2 Drawing Sheets

P-N JUNCTION TYPE BORON PHOSPHIDE-BASED SEMICONDUCTOR LIGHT-EMITTING DEVICE AND PRODUCTION METHOD THEREOF

CROSS-REFERENCE TO RELATED APPLICATIONS

This application claims benefit of Provisional Application 60/367,702, filed Mar. 28, 2002, incorporated herein by reference, under 35 U.S.C. §111(b) pursuant to 35 U.S.C. §119(e) (1).

BACKGROUND OF THE INVENTION

The present invention relates to a boron-phosphide-based semiconductor device having a hetero junction structure; and particularly to a boron-phosphide-based semiconductor light-emitting device exhibiting high emission intensity and method for producing the same.

Boron phosphide (BP) has been traditionally known as a Group III-V compound semiconductor (see Nature, 179, No. 4569 (1957), p. 1075). Since boron phosphide (BP) is an indirect-transition-type semiconductor (see "An Introduction to Semiconductor Device" authored by Iwao Teramoto, first edition, published by Baifukan Co., Ltd. on Mar. 30, 1995, p. 28), BP is considered to be unsuitable for use as a material for formation of a light-emitting layer of a semiconductor light-emitting device. In a conventional boron-phosphide-based semiconductor light-emitting diode (LED) incorporating a boron-phosphide-based semiconductor layer, the boron-phosphide-based semiconductor layer formed of, for example, boron phosphide serves therefore as a buffer layer provided on a single-crystal silicon substrate (see U.S. Pat. No. 6,069,021). Meanwhile, in a laser diode (LD), a boron-phosphide-based semiconductor layer serves as, for example, a contact layer for formation of an ohmic electrode (see Japanese Patent Application Laid-Open (kokai) No. 2-288388).

In general, a light-emitting layer of a semiconductor light-emitting device is formed of a direct-transition-type semiconductor material, which exhibits higher radiative recombination efficiency as compared with an indirect-transition-type semiconductor. In many cases, a light-emitting layer of a boron-phosphide-based semiconductor LED has been conventionally formed of gallium indium nitride ($Ga_xIn_{1-x}N: 0 \leq X \leq 1$) (see Japanese Patent Publication (kokoku) No. 55-3834). A light-emitting layer has been formed especially from $Ga_xIn_{1-x}N(0 \leq X \leq 1)$ which is intentionally doped with an element belonging to Group IV of the periodic table, such as silicon (Si) or germanium (Ge) (see Japanese Patent Application Laid-Open (kokai) No. 6-260680). This is because doping with a Group IV element has been disclosed as producing a $Ga_xIn_{1-x}N(0 \leq X \leq 1)$ light-emitting layer of high emission intensity (see Japanese Patent No. 2560963). In order to produce a semiconductor light-emitting device exhibiting high emission intensity, a light-emitting portion thereof is generally formed of a pn-junction-type double hetero (DH) structure including a light-emitting layer, and p-type and n-type cladding layers which sandwich the light-emitting layer (see Japanese Patent Application Laid-Open (kokai) No. 6-260283).

Conventionally, a p-type boron-phosphide-based semiconductor layer has generally been formed through intentional doping with an element belonging to Group II of the periodic table, such as magnesium (Mg) or zinc (Zn) (see (1) Japanese Patent Application Laid-Open (kokai) No. 2-275682, (2) Japanese Patent Application Laid-Open (kokai) No. 2-288371, (3) Japanese Patent Application Laid-Open (kokai) No. 2-288388, (4) Japanese Patent Application Laid-Open (kokai) No. 10-242514, (5) Japanese Patent Application Laid-Open (kokai) No. 10-242515, and (6) Japanese Patent Application Laid-Open (kokai) No. 10-242567). Meanwhile, an n-type boron-phosphide-based semiconductor layer has generally been formed through doping with a Group IV element such as silicon (Si) (see, for example, Japanese Patent Application Laid-Open (kokai) No. 2-288388). In view of the foregoing, a p-type cladding layer constituting a light-emitting portion of pn-junction-type DH structure has been formed of a p-type boron-phosphide-based semiconductor layer doped with, for example, Mg or Zn. Meanwhile, an n-type cladding layer has been formed of an n-type boron-phosphide-based semiconductor layer doped with silicon (see Japanese Patent Application No. 2001-158282).

Silicon (Si), which is a Group IV element, is described as serving as an amphoteric impurity in a boron-phosphide-based semiconductor, as well as in other Group III-V compound semiconductors (see "Handotai Gijutsu (Jo)" authored by Katsufusa Shohno, ninth printing, published by University of Tokyo Press on Jun. 25, 1992, p. 77). Regarding a boron phosphide semiconductor layer, a technique for formation of an n-type or p-type boron phosphide semiconductor layer which is not intentionally doped; i.e., an undoped boron phosphide semiconductor layer, by appropriately determining the vapor-phase growth temperature of the semiconductor layer (see the aforementioned "Handotai Gijutsu (Jo)," pp. 76–77) has been proposed. Boron vacancies and phosphorus vacancies are considered to determine the conduction type of an undoped boron phosphide semiconductor layer (see "100 Semiconductor Techniques in the Super LSI Generation [III]" authored by Katsufusa Shohno, appendix of a magazine "Electronics," Vol. 27, No. 4, published by Ohmsha, Ltd. on Apr. 1, 1982, pp. 86–87).

Boron-phosphide-based semiconductor layers having different conduction types have been conventionally formed through doping with dopants of different types. When a pn-junction structure including a boron-phosphide-based semiconductor layer is produced, an intricate doping process employing different dopants is therefore required for formation of n-type and p-type boron-phosphide-based semiconductor layers. Even when an attempt is made to produce a light-emitting portion of pn-junction-type DH structure incorporating an undoped boron-phosphide-based semiconductor layer serving as a cladding layer to avoid the intricate doping process, diffusion of a Group IV element (i.e., dopant) from a light-emitting layer into the undoped boron-phosphide-based semiconductor cladding layer cannot be completely prevented. The intensity of light emitted from the light-emitting layer becomes inconsistent because of variation in the diffusion amount of the Group IV element, such as silicon, doped to a light emitting layer for enhancement of emission intensity, into an undoped boron-phosphide-based semiconductor layer. The resultant boron-phosphide-based semiconductor light-emitting device fails therefore to exhibit homogeneous emission intensity.

SUMMARY OF THE INVENTION

In the boron-phosphide-based semiconductor light-emitting device having a pn-junction-type DH structure including a light-emitting layer formed of a semiconductor layer doped with an appropriate amount of a Group IV element (i.e., a dopant for enhancing emission intensity), a boron-phosphide-based semiconductor light-emitting device exhibiting homogeneous and high emission intensity is advantageously produced provided that diffusion of the Group IV element into an undoped boron-phosphide-based semiconductor layer which is readily formed can be suppressed, thereby preventing reduction of the amount of the Group IV element contained in the light-emitting layer.

An object of the present invention is to provide a light-emitting portion of hetero junction structure which is employed for producing a boron-phosphide-based semiconductor light-emitting device exhibiting high emission intensity.

Accordingly, the above object of the present invention has been achieved by providing the following.

(1) A pn-junction-type boron-phosphide-based semiconductor light-emitting device comprising a single-crystal silicon (Si) substrate of first conduction type; a first boron-phosphide-based semiconductor layer of first conduction type formed of an undoped boron-phosphide-based semiconductor of first conduction type containing a Group IV element provided on the substrate; a light-emitting layer provided on the first boron-phosphide-based semiconductor layer, the light-emitting layer formed of a Group III-V semiconductor layer of first or second conduction type which is doped with an element belonging to Group IV of the periodic table provided on the first boron-phosphide-based semiconductor layer; and a second boron-phosphide-based semiconductor layer of second conduction type formed of a boron-phosphide-based semiconductor layer of second conductive type containing a Group IV element provided on the light-emitting layer, wherein the first boron-phosphide-based semiconductor layer, the light-emitting layer, and the second boron-phosphide-based semiconductor layer form a pn-junction hetero structure, and wherein said second conduction type is opposite said first conduction type.

(2) A pn-junction-type boron-phosphide-based semiconductor light-emitting device according to (1) above, wherein the first boron-phosphide-based semiconductor layer contains the same Group IV element as in the light-emitting layer.

(3) A pn-junction-type boron-phosphide-based semiconductor light-emitting device according to (1) or (2) above, wherein the first boron-phosphide-based semiconductor layer contains the Group IV element in an atomic concentration of 70% to 130% to that of the Group IV element contained in the light-emitting layer.

(4) A pn-junction-type boron-phosphide-based semiconductor light-emitting device according to any one of (1) through (3) above, wherein the Group IV element contained in the first boron-phosphide-based semiconductor layer and the light-emitting layer is silicon (Si).

(5) A pn-junction-type boron-phosphide-based semiconductor light-emitting device according to any one of (1) through (4) above, wherein the second boron-phosphide-based semiconductor layer is formed of an undoped boron-phosphide-based semiconductor layer of second conduction type.

(6) A pn-junction-type boron-phosphide-based semiconductor light-emitting device according to any one of (1) through (4) above, wherein the second boron-phosphide-based semiconductor layer is formed of a boron-phosphide-based semiconductor layer of second conduction type intentionally doped with a Group IV element.

(7) A pn-junction-type boron-phosphide-based semiconductor light-emitting device according to any one of (1) through (6) above, wherein the second boron-phosphide-based semiconductor layer contains the same Group IV element as the light-emitting layer.

(8) A pn-junction-type boron-phosphide-based semiconductor light-emitting device according to any one of (1) through (7) above, wherein the second boron-phosphide-based semiconductor layer contains the Group IV element in an atomic concentration of 70% to 130% to that of the Group IV element contained in the light-emitting layer.

(9) A pn-junction-type boron-phosphide-based semiconductor light-emitting device according to any one of (1) through (8) above, wherein the Group IV element contained in the second boron-phosphide-based semiconductor layer and the light-emitting layer is silicon (Si).

(10) A pn-junction-type boron-phosphide-based semiconductor light-emitting device according to (4) above, wherein the first boron-phosphide-based semiconductor layer contains silicon in an atomic concentration equal to or less than a concentration of phosphorus atoms occupying boron vacancies or a concentration of boron atoms occupying phosphorus vacancies.

(11) A pn-junction-type boron-phosphide-based semiconductor light-emitting device according to (9) above, wherein the second boron-phosphide-based semiconductor layer contains silicon in an atomic concentration equal to or less than a concentration of phosphorus atoms occupying boron vacancies or a concentration of boron atoms occupying phosphorus vacancies.

The present invention also provides the following.

(12) A method for producing a pn-junction-type boron-phosphide-based semiconductor light-emitting device as recited in any one of (1) through (11) above, which comprises forming a p-type boron-phosphide-based semiconductor layer at 1,000 to 1,200° C. through an MOCVD method, and forming an n-type boron-phosphide-based semiconductor layer at 750 to 950° C. through an MOCVD method.

DETAILED DESCRIPTION OF THE INVENTION

Figure 1:
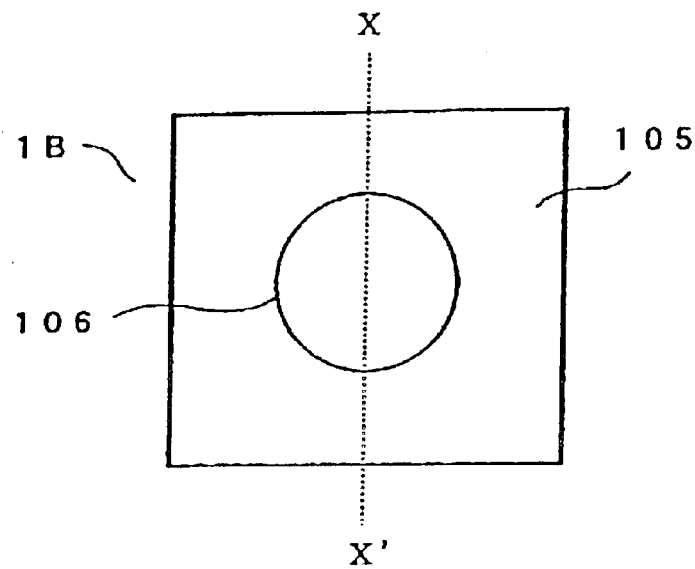
FIG. 1 is a schematic plan view showing an LED of Example 1.

In a first embodiment of the present invention, a substrate may be formed of single-crystal silicon (Si) having a crystal surface plane of {100}, {110}, or {111}; i.e., {100}-, {110}-, or {111}-single-crystal silicon (Si). The substrate may be formed of single-crystal silicon having a crystal surface plane which is inclined by some degrees (°) with respect to a {111} crystal plane. As compared with, for example, a {100} crystal plane of single-crystal silicon, a {111} crystal plane of single-crystal silicon having a diamond crystal structure contains large amounts of silicon atoms. When the substrate is formed of {111}-single-crystal Si, invasion or diffusion of boron (B) atoms and phosphorus (P) atoms constituting a boron-phosphide-based semiconductor layer provided on the substrate into the single-crystal Si substrate can be therefore prevented. The conduction type of single-crystal silicon may be either n-type or p-type. In the present invention, the conduction type of the single-crystal silicon constituting the substrate is designated as a first conduction type. When the substrate is formed of electrically conductive single-crystal silicon, a positive or negative ohmic electrode can be provided as a bottom electrode on the bottom surface of the substrate, whereby a light-emitting device can be readily produced. Particularly when the substrate is formed of an electrically conductive single-crystal material having a specific resistance (resistivity) as low as 1 mΩ·cm or less (preferably 0.1 mΩ·cm or less), the resultant substrate enables production of an LED having a low forward voltage (i.e., Vf). Since the substrate exhibits excellent heat radiation, the substrate is effectively employed for producing an LD exhibiting stable emission.

A first boron-phosphide-based compound semiconductor layer provided on the surface of the single-crystal silicon substrate is formed of a material containing boron (B) and phosphorus (P); for example, $B_\alpha Al_\beta Ga_\gamma In_{1-\alpha-\beta-\gamma} P_{1-\delta} As_\delta$ ($0<\alpha\leq 1$, $0\leq\beta<1$, $0\leq\gamma<1$, $0<\alpha+\beta+\gamma\leq 1$, $0\leq\delta<1$), or $B_\alpha Al_\beta Ga_\gamma In_{1-\alpha-\beta-\gamma} P_{1-\delta} N_\delta$ ($0<\alpha\leq 1$, $0\leq\beta<1$, $0\leq\gamma<1$, $0<\alpha+\beta+\gamma\leq 1$, $0\leq\delta<1$). The first boron-phosphide-based semiconductor layer is the semiconductor layer provided closer to the surface of the single-crystal silicon substrate than the below-described second boron-phosphide-based semiconductor layer. The conduction type of the first boron-phosphide-based semiconductor layer is the same as that of the single-crystal silicon constituting the substrate; i.e., first conduction type. For example, a p-type boron-phosphide-based semiconductor layer of high resistance is provided on a p-type {111}-single-crystal Si substrate.

The first boron-phosphide-based compound semiconductor layer is preferably formed from a material predominantly containing boron and phosphorus in which the composition ($\alpha$) of boron (B) is 0.5 (=50%) or more and the composition ($1-\delta$) of phosphorus (P) is 0.5 (=50%) or more; for example, $B_\alpha Al_\beta Ga_\gamma In_{1-\alpha-\beta-\gamma} P_{1-\delta} As_\delta$ ($0.5 \leq\alpha\leq 1$, $0\leq\beta<0.5$, $0\leq\gamma<0.5$, $0.5<\alpha+\beta+\gamma\leq 1$, $0\leq\delta<0.5$), or $B_\alpha Al_\beta Ga_\gamma In_{1-\alpha-\beta-\gamma} P_{1-\delta} N_\delta$ ($0.5\leq\alpha\leq 1$, $0\leq\beta<0.5$, $0\leq\gamma<0.5$, $0.5<\alpha+\beta+\gamma\leq 1$, $0\leq\delta<0.5$). When a boron-phosphide-based semiconductor mixed crystal predominantly containing boron and phosphorus in which the composition proportion of boron (B) or phosphorus (P) is 0.5 or above is employed, an electrically conductive boron-phosphide-based semiconductor layer of first or second conduction type is advantageously formed without intentional doping of a dopant for regulating a conduction type. Since a boron-phosphide-based semiconductor layer of first conduction type can be formed without performing doping, an intricate doping process (doping of a dopant) is not required for forming a boron-phosphide-based semiconductor layer of first conduction type.

When the first boron-phosphide-based semiconductor layer having the first conduction type which is the same as that of the single-crystal silicon substrate is formed of an undoped layer containing a Group IV element, an intricate process for incorporating a dopant is not required, and invasion or diffusion of a Group IV element—which is incorporated as a dopant into a light-emitting layer for enhancing the intensity of light emitted from the light-emitting layer—into the first boron-phosphide-based semiconductor layer can be prevented. No particular limitations are imposed on the Group IV element contained in the first boron-phosphide-based semiconductor layer. Examples of the Group IV element contained in the first boron-phosphide-based semiconductor layer of first conduction type include carbon (C), silicon (Si), germanium (Ge), and tin (Sn). Of these Group IV elements, carbon (C) and silicon (Si) are preferred because of their rare tendency to diffuse in a Group III-V compound semiconductor layer such as a boron-phosphide-based semiconductor layer. Particularly when the Group IV element contained in the first boron-phosphide-based semiconductor layer is the same as that contained as a dopant in a light-emitting layer, invasion or diffusion of the Group IV element involved in the light-emitting layer into the first boron-phosphide-based semiconductor layer can be prevented. In a second embodiment of the present invention, a silicon-doped light-emitting layer is provided on a first boron-phosphide-based semiconductor layer containing silicon. Alternatively, a carbon-doped light-emitting layer is provided on a first boron-phosphide-based semiconductor layer containing carbon.

The first boron-phosphide-based semiconductor layer of first conduction type containing carbon (C) or silicon (Si) is advantageously formed without intentional doping of the Group IV element. For example, the first boron-phosphide-based semiconductor layer containing silicon is readily formed, when a substrate is formed of single-crystal silicon. When the temperature of the single-crystal silicon substrate is maintained at 750° C. to 1,200° C., particularly at 850° C. to 1,200° C., silicon atoms removed from the substrate enter the first boron-phosphide-based layer, and whereby the first boron-phosphide-based layer containing silicon can be formed. When the first boron-phosphide-based semiconductor layer is formed from an organic boron compound (i.e., a boron (B) source) having a carbon (C)-containing functional group, particularly a saturated or unsaturated aliphatic functional group having a side or straight chain, the first boron-phosphide-based semiconductor layer containing carbon can be readily formed. Even if a carbon-containing compound such as methane ($CH_4$), trimethylarsine ($(CH_3)_3As$), carbon tetrachloride ($CCl_4$), or carbon tetrabromide ($CBr_4$) is not employed as a carbon dopant, the first boron-phosphide-based semiconductor layer containing carbon can be readily formed when an alkyl boron compound which generates carbon through thermal decomposition, such as trimethylboran ($(CH_3)_3B$) or triethylboran ($(C_2H_5)_3B$), is employed. That is, the first boron-phosphide-based semiconductor layer containing carbon can be readily formed from such an alkyl boron compound serving as a boron source through a vapor-phase growth technique (e.g., metal-organic chemical vapor deposition (MOCVD)).

The atomic concentration of a Group IV element such as silicon (Si) or carbon (C) contained in the first boron-phosphide-based semiconductor layer of first conduction type is preferably about 0.5 times to about twice that of a Group IV element contained in a light-emitting layer. When the atomic concentration of the Group IV element contained in the first boron-phosphide-based semiconductor layer exceeds about twice that of the Group IV element contained in the light-emitting layer, the Group IV element is diffused from the first boron-phosphide-based semiconductor layer into the light-emitting layer, and the atomic concentration of the Group IV element in the light-emitting layer becomes unstably high. In contrast, when the atomic concentration of the Group IV element contained in the first boron-phosphide-based semiconductor layer is less than about 0.5 times that of the Group IV element contained in the light-emitting layer, a considerable amount of the Group IV element is diffused from the light-emitting layer into the first boron-phosphide-based semiconductor layer. As a result, the atomic concentration of the Group IV element in the light-emitting layer is lowered, and the light-emitting layer fails to emit light of high intensity. The atomic concentration of the Group IV element contained in the first boron-phosphide-based semiconductor layer is preferably nearly equal to that of the Group IV element contained in the light-emitting layer; i.e., the atomic concentration of the Group IV element in the first boron-phosphide-based semiconductor layer remains within a range of 70% to 130% compared to that of the Group IV element in the light-emitting layer. The smaller difference between the atomic concentration of the Group IV element contained in the light-emitting layer and that of the Group IV element contained in the first boron-phosphide-based semiconductor layer brings about the greater effect on suppressing diffusion of the Group IV element between these layers, which is caused by the difference in atomic concentration. More preferably, the atomic concentration of the Group IV element contained in the first boron-phosphide-based semiconductor layer is the same as that of the Group IV element contained in the light-emitting layer. The atomic concentration of the Group IV element contained in the first boron-phosphide-based semiconductor layer or the light-emitting layer can be measured by means of an analytical technique such as secondary ion mass spectrometry (SIMS) or Auger electron spectrometry.

In a third embodiment of the present invention, when a first boron-phosphide-based semiconductor layer containing silicon (Si) (i.e., Group IV element) is formed by adjusting the film formation temperature, the atomic concentration of silicon contained in the layer is controlled so as to fall within a range of 70% to 130% that of a Group IV element contained in a light-emitting layer. When the film formation temperature is increased; i.e., when the single-crystal silicon substrate is heated to a high temperature, or when the temperature of the substrate is maintained at a high temperature for a long period of time, the atomic concentration of silicon contained in the first boron-phosphide-based semiconductor layer can be increased. For example, a p-type undoped boron phosphide (BP) layer having a silicon atomic concentration of about $4 \times 10^{17}$ atoms/cm$^3$ can be formed on a p-type {111}-single-crystal Si substrate whose temperature is maintained at 1,050° C. However, when the film formation temperature exceeds 1,200° C., a boron phosphide crystal of rhombohedral crystal structure, such as $B_6P$ or $B_{13}P_2$, tends to be formed. When such polyhedral boron phosphide crystal is generated in a first boron-phosphide-based semiconductor layer of cubic zinc-blende crystal structure, considerable amounts of silicon atoms are diffused from the single-crystal silicon substrate into the semiconductor layer through strain or crystal defects generated in the layer by the difference in crystal structure between the layer and the boron phosphide crystal. Therefore, in some cases, the atomic concentration of silicon in the first boron-phosphide-based semiconductor layer exceeds $5 \times 10^{19}$ atoms/cm$^3$, and crystallinity of the semiconductor layer is deteriorated.

When an amorphous or polycrystalline buffer layer is provided between the single-crystal silicon substrate and the first boron-phosphide-based semiconductor layer, the buffer layer having the crystal texture relaxes lattice mismatching between the single-crystal silicon substrate and the first boron-phosphide-based semiconductor layer, as well as traps silicon atoms diffused from the substrate. Therefore, the amount of silicon atoms diffused into the first boron-phosphide-based semiconductor layer is further reduced as compared with the case where the first boron-phosphide-based semiconductor layer is formed directly on the surface of the single-crystal silicon substrate. The greater the thickness of the buffer layer, the greater the amount of silicon atoms trapped in the buffer layer. That is, the amount of silicon atoms in the first boron-phosphide-based semiconductor is regulated by varying the thickness of the buffer layer. The atomic concentration of silicon in the first boron-phosphide-based semiconductor layer is preferably less than the concentration of phosphorus (P) atoms occupying boron vacancies or the concentration of boron (B) atoms occupying phosphorus vacancies. When the atomic concentration of silicon satisfies the above relation, an n-type or p-type undoped boron-phosphide-based semiconductor layer can be readily formed, since silicon serves as an amphoteric impurity.

When a first boron-phosphide-based semiconductor layer containing carbon (C) (i.e., a Group IV element) is formed, the atomic concentration of carbon in the layer is also regulated by controlling the film formation temperature. When the film formation temperature is increased (i.e., when the single crystal silicon substrate is heated to a high temperature), the atomic concentration of carbon contained in the first boron-phosphide-based semiconductor layer is increased. However, the film formation at a temperature exceeding 1,200° C., a boron phosphide crystal of rhombohedral crystal structure, such as $B_6P$ or $B_{13}P_2$, tends to be formed, and thus a boron-phosphide-based semiconductor layer of homogeneous composition fails to be obtained. The concentration of carbon in the first boron-phosphide-based semiconductor layer is increased by increasing the amount of the aforementioned organic boron compound (i.e., boron (B) source) fed into a film formation apparatus. The atomic concentration of carbon in the first boron-phosphide-based semiconductor layer is preferably less than the concentration of phosphorus (P) atoms occupying boron vacancies or the concentration of boron (B) atoms occupying phosphorus vacancies. When the atomic concentration of carbon satisfies the above relation, an undoped boron-phosphide-based semiconductor layer of first conduction type can be formed, since carbon serves as an amphoteric impurity. The concentration of boron atoms occupying phosphorus vacancies and the concentration of phosphorus atoms occupying boron vacancies is measured as the number of boron-boron (B—B) bonds and the number of phosphorus-phosphorus (P—P) bonds, respectively, through Raman spectroscopy, nuclear magnetic resonance (NMR), or a similar technique.

A Group III-V compound semiconductor light-emitting layer according to the first embodiment of the present invention can be formed of a Group III nitride semiconductor such as gallium indium nitride ($Ga_XIn_{1-X}N$: $0 \leq X \leq 1$) or gallium nitride phosphide ($GaN_{1-Y}P_Y$: $0 \leq Y \leq 1$). A Group III nitride semiconductor layer which is intentionally doped with, for example, a Group IV element is preferably employed as a light-emitting layer. Examples of dopants which may be incorporated into the light-emitting layer include silicon (Si) and carbon (C). Of these, silicon is preferred, since silicon does not tend to diffuse to the outside of the light-emitting layer, as compared with other Group IV elements such as germanium (Ge) and tin (Sn), and doping of silicon can be readily performed as compared with the case of carbon (C). The amount of a Group IV element contained in the light-emitting layer is preferably about $1 \times 10^{17}$ atoms/cm$^3$ to about $1 \times 10^{19}$ atoms/cm$^3$, more preferably about $5 \times 10^{18}$ atoms/cm$^3$ to about $7 \times 10^{18}$ atoms/cm$^3$. When the light-emitting layer is doped with a Group IV element in an amount of more than $1 \times 10^{19}$ atoms/cm$^3$, crystallinity of the light-emitting layer is deteriorated, and the light-emitting layer fails to emit light of high intensity. The conduction type of the light-emitting layer of the first or second conduction type. When a light-emitting layer of second conduction type is formed on the first boron-phosphide-based semiconductor layer of first conduction type, a single hetero (SH)-type pn-junction structure is formed. Meanwhile, when the below-described second boron-phosphide-based semiconductor layer of second conduction type is formed on a light-emitting layer of first conduction type, a light-emitting portion of double hetero (DH) structure including a pn-junction structure formed of the light-emitting layer and the second boron-phosphide-based semiconductor layer is produced.

In a fourth embodiment of the present invention, a first boron-phosphide-based semiconductor layer is formed of a silicon-containing undoped boron gallium phosphide ($B_xGa_{1-x}P$: $0.5 \leq X \leq 1$) layer, and a light-emitting layer is formed of silicon-doped gallium nitride phosphide ($GaN_{1-Y}P_Y$: $0 \leq Y \leq 1$) containing silicon (atomic concentration: $2 \times 10^{17}$ atoms/cm$^3$).

A light-emitting layer can be formed of a single quantum well (SQW) structure or a multiple quantum well (MQW) structure. In a quantum well structure utilizing the tunnel effect of carriers, a barrier layer having a thickness greater than that of a well layer must be formed of a thin film. A light-emitting layer of quantum well structure including continuous thin films is formed on a boron-phosphide-based semiconductor layer provided on the single-crystal silicon substrate using a growth reactor in which a coating containing boron (B) and phosphorus (P) has been deposited onto the inner wall before film formation. The aforementioned coating suppresses release of a contaminant derived from the inner wall of the growth furnace or from decomposition products deposited onto the inner wall. A boron-phosphide-based semiconductor layer exhibiting excellent surface flatness and continuity can be therefore formed, and thus a light-emitting layer exhibiting excellent surface flatness and continuity can be suitably formed.

When a light-emitting layer which emits light having a wavelength of λ is formed on a first boron-phosphide-based semiconductor layer of predetermined thickness which reflects light (wavelength: λ) at a reflectivity of at least 30%, an LED exhibiting excellent emission extraction efficiency is advantageously produced, because the first boron-phosphide-based semiconductor layer reflects partially light emitted from the light-emitting layer. For example, a light-emitting layer which emits violet light (wavelength: 420 nm) is formed on the first boron-phosphide-based semiconductor layer having a thickness of about 300 nm. When the first boron-phosphide-based semiconductor layer is formed of boron monophosphide (BP), emitted light (wavelength: 420 nm≦λ≦490 nm) and the thickness (d, unit: nm) of the first boron-phosphide-based semiconductor layer which reflects the light at a reflectivity of at least 30% satisfy the following relation (1).

$$\lambda = 0.135 \cdot d + 380 \quad (1)$$

In a fifth embodiment of the present invention, a second boron-phosphide-based semiconductor layer of second conduction type provided on the aforementioned light-emitting layer is formed of an undoped boron-phosphide-based semiconductor layer. Like the case of the first boron-phosphide-based semiconductor layer, the second boron-phosphide-based semiconductor layer is formed of, for example, $B_\alpha Al_\beta Ga_\gamma In_{1-\alpha-\beta-\gamma}P_{1-\delta}As_\delta$ ($0<\alpha \leq 1, 0 \leq \beta <1, 0 \leq \gamma <1, 0<\alpha+\beta+\gamma \leq 1, 0 \leq \delta <1$), or $B_\alpha Al_\beta Ga_\gamma In_{1-\alpha-\beta-\gamma}P_{1-\delta}N_\delta$ ($0<\alpha \leq 1, 0 \leq \beta <1, 0 \leq \gamma <1, 0<\alpha+\beta+\gamma \leq 1, 0 \leq \delta <1$). The second boron-phosphide-based semiconductor layer is the semiconductor layer provided facing to the aforementioned first boron-phosphide-based semiconductor layer sandwich the light-emitting layer. The second boron-phosphide-based semiconductor layer is the conductive semiconductor layer forming a light-emitting portion of the pn-junction type DH structure by sandwiching the light-emitting layer with the first boron-phosphide-based semiconductor layers. The conduction type of the second boron-phosphide-based semiconductor layer is opposite to that of the single-crystal silicon constituting the substrate or the first boron-phosphide-based semiconductor layer. For example, when the {111}-single-crystal silicon substrate and the first boron-phosphide-based semiconductor layer are of p-type, the second boron-phosphide-based semiconductor layer is of n-type.

Preferably, the second boron-phosphide-based semiconductor layer is formed of a material predominantly containing boron and phosphorus in which the composition (α) of boron (B) is at least 0.5 (=50%) and the composition (1-δ) of phosphorus (P) is at least 0.5 (=50%); for example, $B_\alpha Al_\beta Ga_\gamma In_{1-\alpha-\beta-\gamma}As_\delta$ ($0.5 \leq \alpha \leq 1, 0 \leq \beta <0.5, 0 \leq \gamma <0.5, 0.5<\alpha=\beta+\gamma \leq 1, 0 \leq \delta <0.5$) or $B_\alpha Al_\beta Ga_{\gamma In1-\alpha-\beta-\gamma}P_{1-\delta}N_{67}$ ($0.5 \leq \alpha \leq 1, 0 \leq \beta <0.5, 0 \leq \gamma <0.5, 0.5<\alpha+\beta+\gamma \leq 1, 0 \leq \delta <0.5$). When a boron-phosphide-based semiconductor mixed crystal predominantly containing boron (B) and phosphorus (P) is employed, an electrically conductive boron-phosphide-based semiconductor layer of the second conduction type is advantageously formed without intentional doping of a dopant for regulating a conduction type. That is, a boron-phosphide-based semiconductor layer of second conduction type can be readily formed without performing doping.

When the first and the second boron-phosphide-based semiconductor layers are formed of undoped layers, a doping process employing various dopants is not required. In addition, an electrically conductive layer of low resistance having high carrier concentration can be readily formed by regulating the ratio between the concentrations of donor and acceptor components occupying boron (B) vacancies or phosphorus (P) vacancies. For example, an n-type boron-phosphide-based semiconductor layer of low resistance (carrier concentration: more than about $5 \times 10^{18}$ cm$^{-3}$) can be formed without performing doping. Alternatively, a p-type boron-phosphide-based semiconductor layer of low resistance (carrier concentration: more than about $1 \times 10^{19}$ cm$^{-3}$) can be readily formed without performing doping. Even when a boron-phosphide-based semiconductor layer is doped with a large amount of an n-type dopant (e.g., a Group VI element such as sulfur (S) or selenium (Se)), difficulty is encountered in increasing the concentration of electrons in the resultant semiconductor layer (unlike the case of the aforementioned undoped semiconductor layer), and the semiconductor layer having a rough surface and discontinuities is inversely formed by the doping with a large amount of dopant. Even when a boron-phosphide-based semiconductor layer is doped with a large amount of a p-type dopant (e.g., a Group II element which tends not to form a compound with boron (B), such as zinc (Zn) or cadmium (Cd)), a boron-phosphide-based semiconductor layer of low resistance having high hole concentration fails to be obtained reliably. In addition, the resultant semiconductor layer has a rough surface and exhibits discontinuities. Therefore, a procedure in which intentional doping is not performed (undoping) is preferred in both cases for forming n-type and p-type boron-phosphide-based semiconductor layers.

The conduction type of an undoped boron-phosphide-based semiconductor layer can be regulated by controlling the film formation temperature. The temperature suitable for forming an undoped n-type boron-phosphide-based semiconductor layer is about 750° C. to about 950° C. The temperature suitable for forming an undoped p-type boronphosphide-based semiconductor layer is about 1,000° C. to about 1,200° C. A temperature of about 1,025° C. to about 1,100° C. is preferred particularly. A boron-phosphide-based semiconductor layer formed at a temperature higher than about 1,000° C., particularly a boron monophosphide layer containing twining having a {111}-crystal plane as a twin boundary, is suitably employed as the first or the second boron-phosphide-based semiconductor layer. The twining contained in the boron-phosphide-based semiconductor layer results in a boron-phosphide-based semiconductor layer with excellent crystallinity by relaxing lattice misfit between the layer and a light-emitting layer. The ratio of the amount of a Group V element (e.g., phosphorus (P)) fed to a film formation apparatus to that of a Group III element (e.g., boron (B)) fed to the apparatus (i.e., V/III ratio) also affects the conduction type of a boron-phosphide-based semiconductor layer. In the case where the film formation temperature is the same, an undoped n-type boron-phosphide-based semiconductor layer tends to be formed when the V/III ratio is increased.

In a sixth embodiment of the present invention, the second boron-phosphide-based semiconductor layer is formed of a boron-phosphide-based semiconductor layer of second conduction type which is intentionally doped with a Group IV element. Unlike the case of the first boron-phosphide-based semiconductor layer, the second boron-phosphide-based semiconductor layer is provided at a position away from the single-crystal silicon substrate surface. Therefore, the amount of silicon atoms diffused from the single-crystal silicon substrate into the second boron-phosphide-based semiconductor layer is less than that of silicon atoms diffused into the first boron-phosphide-based semiconductor layer. Unlike the case of the first boron-phosphide-based semiconductor layer, doping of a Group IV element into the second boron-phosphide-based semiconductor layer is advantageously to obtain the above-described atomic concentration of the Group IV in the layer. Examples of the Group IV elements which may be incorporated into the layer include carbon (C), silicon (Si), germanium (Ge), and tin (Sn). Examples of doping sources for carbon include carbon-containing compounds, such as methane ($CH_4$), trimethylphosphine (($CH_3)_3P$), and carbon tetrabromide ($CBr_4$). Examples of doping sources for silicon include silicon-containing gases, such as silane ($SiH_4$) and disilane ($Si_2H_6$).

Since a conductive layer with high carrier concentration can be obtained without doping of an n-type or p-type dopant as described above, in the present embodiment, doping of a Group IV element is performed not in order to regulate the conduction type of the second boron-phosphide-based semiconductor layer, but in order to suppress diffusion of the Group IV element in the light-emitting layer into the second boron-phosphide-based semiconductor layer, for maintaining the atomic concentration of the Group IV element in the light-emitting layer so as to attain emission of high intensity. The atomic concentration of the Group IV element in the second boron-phosphide-based semiconductor layer is controlled to be equal to or less than the concentration of phosphorus atoms occupying boron vacancies or the concentration of boron atoms occupying phosphorus vacancies, which determines the conduction type of the second boron-phosphide-based semiconductor layer. The layer exhibits poor surface flatness when the atomic concentration of the Group IV element incorporated into the second boron-phosphide-based semiconductor layer exceeds the concentration of a donor or acceptor component occupying such vacancies.

In a seventh embodiment of the present invention, a Group IV element contained in the second boron-phosphide-based semiconductor layer is the same as that contained in the light-emitting layer. When the same Group IV element is incorporated into the light-emitting layer and the second boron-phosphide-based semiconductor layer, diffusion of the Group IV element between these layers can be suppressed. Furthermore, by setting the atomic concentration of the Group IV element in the light-emitting layer nearly equal to that of the Group IV element in the second boron-phosphide-based semiconductor layer can suppress the diffusion of the Group IV element from the light-emitting layer into the second boron-phosphide-based semiconductor layer, as well as diffusion of the Group IV element from the second boron-phosphide-based semiconductor layer into the light-emitting layer can be suppressed. The atomic concentration of the Group IV element contained in each of the light-emitting layer or the second boron-phosphide-based semiconductor layer is controlled by the doping amount of the Group IV element. The atomic concentration of the Group IV element in the second boron-phosphide-based semiconductor layer must be regulated on the basis of the atomic concentration of the Group IV element in the light-emitting layer which is chosen for attaining emission of high intensity. If the atomic concentration of the Group IV element in the first or the second boron-phosphide-based semiconductor layer is not equal to the optimized atomic concentration of the Group IV element in the light-emitting layer, the atomic concentration of the Group IV element in the first or the second boron-phosphide-based semiconductor layer is preferably controlled so as to fall within a range of 70% to 130% the optimal atomic concentration of the Group IV element in the light-emitting layer. The atomic concentration of the Group IV element in the first or the second boron-phosphide-based semiconductor layer is controlled more preferably to be equal to that of the Group IV element in the light-emitting layer, thereby suppressing diffusion of the Group IV element between these layers so that the light-emitting layer emits light of high intensity.

With an increase in the difference in the atomic concentration of the Group IV element between the light-emitting layer and the second boron-phosphide-based semiconductor layer, the diffusion of the Group IV element between the light-emitting layer and the second boron-phosphide-based semiconductor layer becomes significant. Therefore, the atomic concentration of the Group IV element in the second boron-phosphide-based semiconductor layer preferably falls within a range of 70% to 130% compared to that of the Group IV element in the light-emitting layer. More preferably, the atomic concentration of the Group IV element in the second boron-phosphide-based semiconductor layer is equal to that of the Group IV element in the light-emitting layer.

In an eighth embodiment of the present invention, a second boron-phosphide-based semiconductor layer formed of an n-type boron phosphide layer (silicon atomic concentration: $3 \times 10^{18}$ atoms/$cm^3$) is provided on an n-type light-emitting layer (silicon atomic concentration: $3 \times 10^{18}$ atoms/$cm^3$). Especially when atoms of the Group IV element are homogeneously distributed in the second boron-phosphide-based semiconductor layer, particularly in a thickness direction thereof, diffusion of the Group IV element from the light-emitting layer into the second boron-phosphide-based semiconductor layer is suppressed provided that the first and the second boron-phosphide-based semiconductor layers of different conduction types which sandwich the light-emitting layer are formed of the same material with the same thickness. By equalizing the amount of strain applied to the light-emitting layer from the first and the second boron-phosphide-based semiconductor layers, diffusion of the Group IV element from the light-emitting layer into the first and second boron-phosphide-based semiconductor layers is more suppressed.

In a ninth embodiment of the present invention, the Group IV element contained in the second boron-phosphide-based semiconductor layer and the light-emitting layer is silicon (Si). Among the Group IV elements, Si is one of elements hard to diffuse, and therefore diffusion of silicon from the second boron-phosphide-based semiconductor layer into the light-emitting layer is efficiently suppressed. Furthermore, the second boron-phosphide-based semiconductor with the atomic concentration of silicon falling within a range of 70% to 130% that of silicon in the light-emitting layer suppresses the diffusion of silicon from the second boron-phosphide-based semiconductor layer into the light-emitting layer, and is therefore more effective to maintain the atomic concentration of silicon in the light-emitting layer at an optimal level. An example structure of a light-emitting portion is a hetero junction structure including an n-type $Ga_xIn_{1-x}N$ ($0 \leq X \leq 1$) light-emitting layer (silicon atomic concentration: about $4 \times 10^{18}$ atoms/cm$^3$) together with the first and the second boron phosphide (BP) layers (silicon atomic concentration: about $5 \times 10^{18}$ atoms/cm$^3$).

Supposing that the first conduction type is p-type, the first boron-phosphide-based semiconductor layer can be formed of, for example, an undoped p-type boron phosphide (BP) layer. In the undoped p-type boron phosphide (BP) layer, a large amount of boron atoms occupying phosphorus vacancies which serve as an acceptor component is present. Even when silicon atoms (atomic concentration: $10^{18}$ cm$^{-3}$ to $10^{19}$ cm$^{-3}$) are incorporated into the undoped p-type boron phosphide (BP) layer constituting the first boron-phosphide-based semiconductor layer, the concentration of holes in the undoped p-type boron phosphide (BP) layer is not reduced significantly, and thus the conduction type does not vary. Meanwhile, when the first conduction type is n-type, and the first boron-phosphide-based semiconductor layer is formed of, for example, an undoped n-type boron phosphide (BP) layer, the undoped n-type BP layer contains phosphorus atoms occupying boron vacancies, which serve as a donor component, in an atomic concentration about 100 times that of silicon atoms less than $10^{18}$ cm$^{-3}$ to $10^{19}$ cm$^{-3}$. Therefore, if an amphoteric impurity, such as silicon, serves as an acceptor, a large amount of the donor related to vacancies is insufficiently electrically compensated with silicon, and thus the conduction type of the first boron-phosphide-based semiconductor layer is maintained as n-type.

In a tenth embodiment of the present invention, the first and the second boron-phosphide-based semiconductor layers are formed from such that the atomic concentration of a Group IV element contained therein is equal to or less than the concentration of a donor or acceptor component related to the aforementioned vacancies. Although a large amount of a Group IV element is doped to electrically compensate the donor or acceptor relating to the vacancies, precipitates containing the Group IV element (i.e., dopant) are generated by the doping excess solid solubility of the Group IV element, and the resultant boron-phosphide-based semiconductor layer with a rough and non-flat surface is formed. As described herein, a boron-phosphide-based semiconductor layer of low resistance employed for forming a cladding layer to a light-emitting layer can be most suitably and readily formed of an undoped boron-phosphide-based semiconductor layer.

Operation

The Group IV element contained in the first and the second boron-phosphide-based semiconductor layers of different conduction types suppresses diffusion of a Group IV element—which is intentionally incorporated as a dopant into a light-emitting layer—into the first and the second boron-phosphide-based semiconductor layers, as well as maintains the atomic concentration of the Group IV element in the light-emitting layer at an optimized level for attaining emission of high intensity.

Silicon which is incorporated into the first and the second boron-phosphide-based semiconductor layers as a Group IV element suppresses the diffusion of atoms of the Group IV element from the first or the second boron-phosphide-based semiconductor layer into the light-emitting layer, as well as diffusion of the Group IV element atoms from the light-emitting layer into the first or second boron-phosphide-based semiconductor layer, without change of the conduction type of each of the first and the second undoped boron-phosphide-based semiconductor layers.

EXAMPLES

The present invention is described in further detail with reference to the following representative Examples. However, the present invention should not be construed as being limited thereto.

Example 1

The present invention will next be described in detail with reference to the following specific embodiment, in which a boron-phosphide-based semiconductor LED is produced from a first boron-phosphide-based semiconductor layer of n-type (i.e., first conduction type) and a second boron-phosphide-based semiconductor layer of p-type (i.e., second conduction type).

Figure 2:
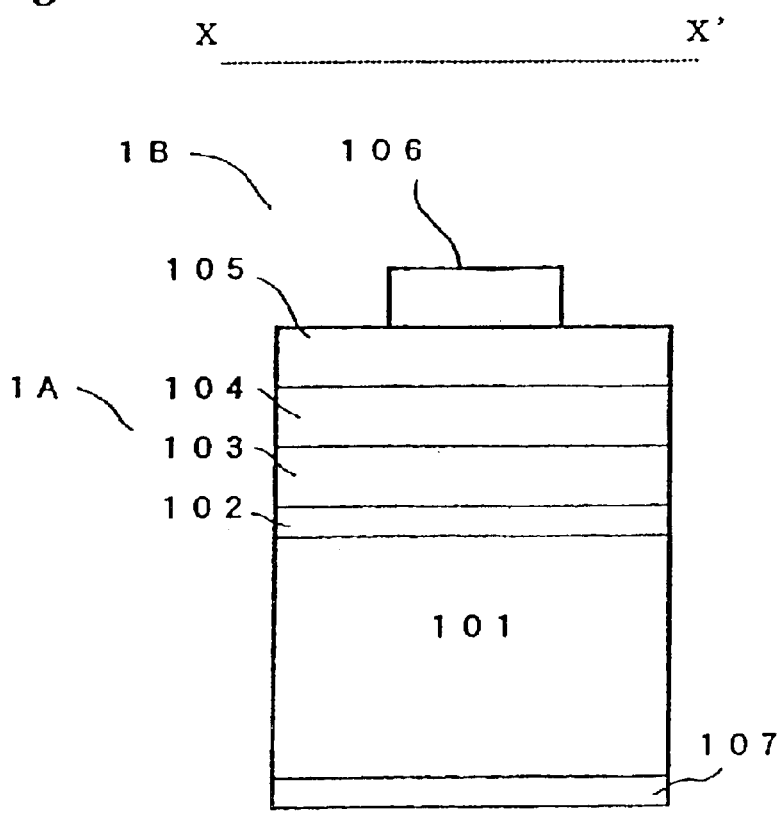
FIG. 2 is a schematic cross-sectional view of the LED shown in FIG. 1 taken along broken line X-X'.

FIG. 1 shows a schematic plan view of an LED 1B of Example 1. FIG. 2 shows a schematic cross-sectional view of the LED 1B shown in FIG. 1 taken along broken line X-X'.

In a stacked layer structure 1A for the LED 1B, a substrate 101 was formed of antimony (Sb)-doped n-type single-crystal Si having a (111) crystal surface plane. On the substrate 101 was formed a boron phosphide buffer layer 102 (thickness: 5 nm) predominantly containing an amorphous structure in an as-grown state. The buffer layer 102 was formed through a triethylboran (($C_2H_5)_3B$)/phosphine ($PH_3$)/hydrogen ($H_2$) MOCVD method under atmospheric pressure at 350° C.

After completion of formation of the buffer layer 102, the temperature of the substrate 101 was increased to 1,050° C. Subsequently, on the surface of the buffer layer 102, a first boron-phosphide-based semiconductor layer 103 (thickness: about 330 nm) comprising an undoped n-type boron phosphide (BP) layer was formed through the aforementioned MOCVD method. After completion of formation of the first boron-phosphide-based semiconductor layer 103 of first conduction type (n-type in Example 1), the first boron-phosphide-based semiconductor layer 103 was maintained at 1,050° C. for 10 minutes in an atmosphere containing phosphine ($PH_3$) and hydrogen ($H_2$), to thereby promote diffusion of silicon atoms from the single-crystal silicon substrate 101 into the first boron-phosphide-based semiconductor layer 103. The atomic concentration of silicon in the first boron-phosphide-based semiconductor layer 103 was measured by means of typical secondary ion mass spectrometry (SIMS), and found to be about $4 \times 10^{18}$ cm$^{-3}$. The carrier concentration of the first boron-phosphide-based semiconductor layer 103 was found to be about $8 \times 10^{18}$ cm$^{-3}$. The band gap of the BP layer constituting the first boron-phosphide-based semiconductor layer 103 at room temperature was calculated to be about 3.0 eV on the basis of photon-energy dependence of the product (2·η·κ) of refractive index (η) and extinction coefficient (κ).

On the first boron-phosphide-based semiconductor layer 103, a light-emitting layer 104 containing n-type gallium indium nitride (Ga$_{0.94}$In$_{0.06}$N) was formed. The light-emitting layer 104 was formed through a trimethylgallium ((CH$_3$)$_3$Ga)/trimethylindium ((CH$_3$)$_3$In)/ammonia (NH$_3$)/H$_2$ MOCVD method under atmospheric pressure at 850° C. During the course of formation of the light-emitting layer 104, the layer 104 was doped with silicon (Si) by use of a gas mixture of disilane (Si$_2$H$_6$) and hydrogen (H$_2$). The doping amount of silicon to the light-emitting layer 104 was regulated such that the atomic concentration of silicon in the layer 104 was about $5 \times 10^{18}$ cm$^{-3}$. The thickness of the light-emitting layer 104 was controlled to 50 nm.

On the surface of the light-emitting layer 104, a second boron-phosphide-based semiconductor layer 105 comprising p-type (i.e., second conduction type) boron phosphide (BP) was formed. As in the case of the second boron-phosphide-based semiconductor layer, the second boron-phosphide-based semiconductor layer 105 of the second conduction type (p-type in Example 1) was formed through a (C$_2$H$_5$)$_3$B/PH$_3$/H$_2$ MOCVD method under atmospheric pressure at 850° C. Based on the atomic concentration of residual silicon in the second boron-phosphide-based semiconductor layer 105 was about $2 \times 10^{17}$ cm$^{-3}$, the layer 105 was doped with silicon to reach a total atomic concentration of silicon of about $4 \times 10^{18}$ cm$^{-3}$ using a gas mixture of disilane and hydrogen. The carrier concentration of the second boron-phosphide-based semiconductor layer 105 was controlled to about $1 \times 10^{19}$ cm$^{-3}$. The thickness of the layer 105 was controlled to about 330 nm, which is equal to that of the first boron-phosphide-based semiconductor layer 103. As in the case of the first boron-phosphide-based semiconductor layer 103, the second boron-phosphide-based semiconductor layer 105 was formed of boron monophosphide (BP) having a band gap of about 3.0 eV at room temperature.

Figure 3:
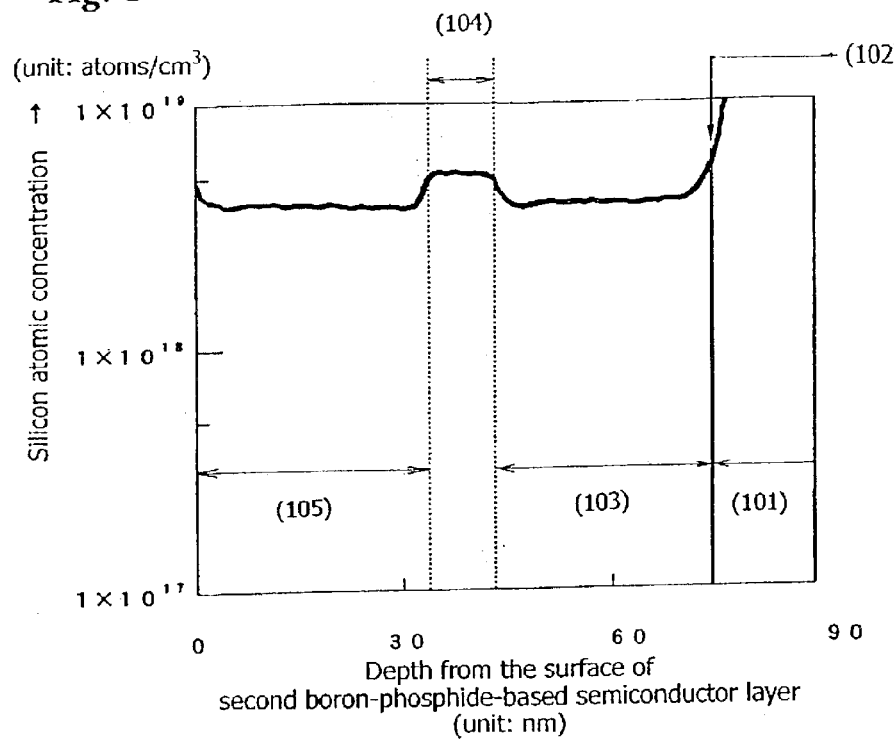
FIG. 3 shows atomic concentration of silicon contained in the LED of Example 1 as a function of depth.

A light-emitting portion of pn-junction type double hetero (DH) structure was formed of the light-emitting layer 104, the first boron-phosphide-based semiconductor layer 103, and the second boron-phosphide-based semiconductor layer 105. The layers 103 and 105 having different conduction types. FIG. 3 shows the in-depth profile measured by SIMS for the atomic concentration of silicon contained in each of the layers 103 through 105 constituting the light-emitting portion. The atomic concentration of silicon contained in each of the first and the second boron-phosphide-based semiconductor layers 103 and 105 was about 0.8 times that of silicon contained in the light-emitting layer 104. That is, the atomic concentration of silicon in the first or the second boron-phosphide-based semiconductor layer was about 20% lower than that of silicon in the light-emitting layer 104. As shown in FIG. 3, silicon atoms are also recognized to distribute almost homogeneously within each of the layers 103 through 105 with respect to the depth direction (thickness direction). Owing to the balance in the silicon atomic concentrations was kept among the light-emitting layer 104, the first boron-phosphide-based semiconductor layer 103, and the second boron-phosphide-based semiconductor layer 105, and the first and the second boron-phosphide-based semiconductor layers 103 and 105 sandwiching the light-emitting layer 104 were formed of the same semiconductor material (BP) with the same thickness, diffusion of silicon atoms from the light-emitting layer 104 into the first or the second boron-phosphide-based semiconductor layer 103 or 105 is considered to be suppressed, as is diffusion of silicon atoms from the first or the second boron-phosphide-based semiconductor layer 103 or 105 into the light-emitting layer 104.

A top electrode 106 was formed on a center portion of the surface of the p-type second boron-phosphide-based semiconductor layer 105. The top electrode 106 was formed of an Au—Zn/nickel (Ni)/gold (Au) three-layer structure including an ohmic electrode formed of a gold-zinc (Au—Zn) alloy which was in direct contact with the layer 105. The diameter of the circular top electrode 106 also serving as a pad electrode for wire-bonding was regulated to about 120 μm. An ohmic electrode containing an aluminum·antimony (Al—Sb) alloy, serving as a bottom electrode 107, was formed on almost the entire bottom surface of the n-type single-crystal Si substrate 101, to thereby produce the LED 1B. The thickness of the Al—Sb deposition film was regulated to about 2 μm. After the top electrode 106 and the bottom electrode 107 were formed, the LED 1B was subjected to cutting so as to form a square LED 1B chip having a size of about 350 μm× about 350 μm.

When an operation current of 20 mA was applied to the top electrode 106 and the bottom electrode 107 in a forward direction, violet light having a wavelength of about 430 nm was emitted from the LED 1B chip. The luminance of the LED 1B chip was measured by use of a typical integrating sphere, and was 9 mcd; i.e., the high emission intensity LED 1B was provided. Forward voltage (Vf) was about 3 V (forward current=20 mA), and reverse voltage (V$_R$) was 5 V or more (reverse current=10 μA). The excellent rectification characteristics obtained indicate suppressed disordering of the hetero junction interface caused by diffusion of silicon atoms between the light-emitting layer 104 and the first or the second boron-phosphide-based semiconductor layer 103 or 105 (see "Fundamental Technique of Optoelectronic Integrated Circuit" edited by *Hikari Gijutsu Kyodo Kenkyusho*, first edition, first printing, published by Ohmsha, Ltd. on Aug. 20, 1989, pp. 371–384).

Example 2

The present invention will next be described in detail with reference to the following specific embodiment, in which a boron-phosphide-based semiconductor LED is produced from a first boron-phosphide-based semiconductor layer of p-type (i.e., first conduction type) and a second boron-phosphide-based semiconductor layer of n-type (i.e., second conduction type).

Figure 4:
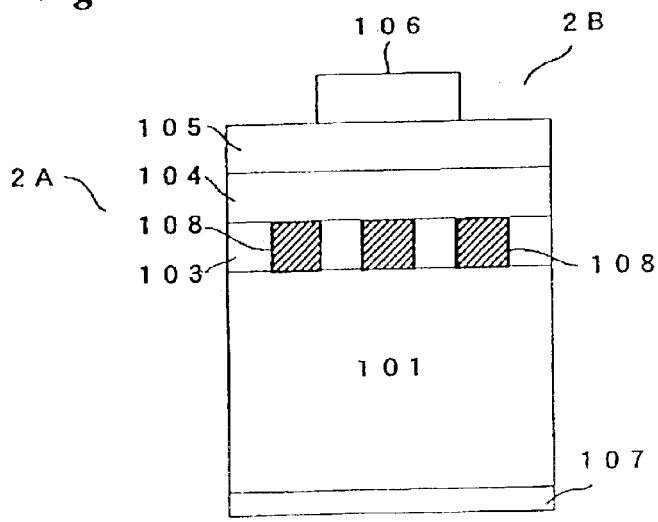
FIG. 4 is a schematic cross-sectional view showing an LED of Example 2.

FIG. 4 shows a schematic cross-sectional view of an LED 2B of Example 2. Structural elements common to those constituting a stacked layer structure 2A shown in FIG. 4 and the stacked layer structure 1A shown in FIGS. 1 and 2 are denoted by the same reference numerals.

In the stacked layer structure 2A for the LED 2B, a substrate 101 was formed of boron (B)-doped p-type single-crystal Si having a (111) crystal surface plane.

On the surface of the substrate 101, a first boron-phosphide-based semiconductor layer 103 comprising an undoped p-type boron phosphide (BP) layer was formed. The layer 103 was formed through a (C$_2$H$_5$)$_3$B/PH$_3$/H$_2$ MOCVD method under reduced pressure at 1,075° C. During the course of formation of the layer 103, the pressure was maintained at about 0.2 atm. During the course of 15-minute formation of the first boron-phosphide-based semiconductor layer 103 of first conduction type (p-type in Example 2), silicon atoms diffused from the single-crystal silicon substrate 101 into the layer 103, and the atomic concentration of silicon in the layer 103 reached about $7 \times 10^{18}$ cm$^{-3}$. The layer 103 containing silicon atoms at such a high concentration exhibited p-type conductivity on the basis of the direction of thermal electromotive force (see the aforementioned "Handotai Gijutsu (Jo)," pp. 119–120) and have a carrier concentration of about $2 \times 10^{19}$ cm$^{-3}$. The thickness of the first boron-phosphide-based semiconductor layer 103 was controlled to about 210 nm. The BP layer constituting the first boron-phosphide-based semiconductor layer 103 had a band gap of about 3.0 eV at room temperature.

The first boron-phosphide-based semiconductor layer 103 was also formed at a film formation rate of 30 nm/minute with the ratio by amount of $PH_3$ to $(C_2H_5)_3B$ fed to an MOCVD reaction system (i.e., $PH_3/(C_2H_5)_3B$) was set to 90. The layer 103 was found to contain twining 108 with almost uniform density. The twining 108 was one having {111}-crystal plane of boron phosphide (BP) as a twining plane. The twining is considered to be a type of stacking fault (see "Crystal Electronmicroscopy" authored by Kimiyasu Saka, first edition, published by Uchida Rokakuho on Nov. 25, 1997, pp. 111–112). The twin crystals 108 were, however, not clearly determined to be intrinsic or extrinsic-type stacking faults (see the aforementioned "Crystal Electronmicroscopy," p. 141).

On the first boron-phosphide-based semiconductor layer 103, an Si-doped n-type gallium indium nitride ($Ga_{0.90}In_{0.01}N$) light-emitting layer 104 (thickness: about 50 nm) was formed through a $(CH_3)_3Ga/(CH_3)_3In/NH_3/H_2$ reduced-pressure MOCVD method at 800° C. The light-emitting layer 104 was formed under the reduced pressure of about 0.8 atm. During the course of formation of the light-emitting layer 104, the layer 104 was doped with silicon using a $Si_2H_6$—$H_2$ gas mixture so that the atomic concentration of silicon in the layer 104 became about $7 \times 10^{18}$ cm$^{-3}$. The atomic concentration of silicon in the first boron-phosphide-based semiconductor layer 103 was considerably lower than the concentration of boron (B) atoms occupying phosphorus (P) vacancies, and the layer 103 exhibited excellent surface flatness. Therefore, the light-emitting layer 104 formed on the first boron-phosphide-based semiconductor layer 103 exhibited surface flatness without hillocks.

On the surface of the light-emitting layer 104, a second boron-phosphide-based semiconductor layer 105 containing n-type boron phosphide (BP) was formed. The atomic concentration of silicon contained in the second boron-phosphide-based semiconductor layer 105 was about $4 \times 10^{17}$ cm$^{-3}$. Therefore, during the course of formation of the second boron-phosphide-based semiconductor layer 105 of second conduction type (n-type in Example 2), the layer 105 was doped with silicon using a gas mixture of disilane and hydrogen so that the total atomic concentration of silicon contained therein became about $7 \times 10^{18}$ cm$^{-3}$. The silicon atomic concentration was found to be considerably lower than the concentration of phosphorus (P) atoms occupying boron (B) vacancies, and therefore inversion of the conduction type of the second boron-phosphide-based semiconductor layer was not recognized. Generation of silicon-containing precipitates was not recognized in the second boron-phosphide-based semiconductor layer 105, and the layer 105 exhibited a flat and continuous surface. The carrier concentration of the second boron-phosphide-based semiconductor layer 105 was regulated to about $1 \times 10^{19}$ cm$^{-3}$. The thickness of the layer 105 was controlled to about 210 nm, which was equal to that of the first boron-phosphide-based semiconductor layer 103. The second boron-phosphide-based semiconductor layer 105 was formed of boron monophosphide (BP) having a band gap of about 3.0 eV at room temperature. A light-emitting portion of pn-junction type double hetero (DH) structure was formed of the light-emitting layer 104, the first boron-phosphide-based semiconductor layer 103, and the second boron-phosphide-based semiconductor layer 105. The layers 103 and 105 having different conduction types.

A top electrode 106 was formed on a center portion of the surface of the n-type second boron-phosphide-based semiconductor layer 105. The top electrode 106 was formed of an Au—Ge/Ni/Au three-layer structure including a gold-germanium (Au—Ge) alloy layer which was in direct contact with the layer 105. The diameter of the circular top electrode 106 also serving as a pad electrode was regulated to about 110 μm. An ohmic electrode containing aluminum (Al) serving as a bottom electrode 107 was formed on almost the entire bottom surface of the p-type single-crystal Si substrate 101, to thereby produce the LED 2B. The thickness of the Al vacuum deposition film was controlled to about 3 μm. After the top electrode 106 and the bottom electrode 107 were formed, the LED 2B was subjected to cutting so as to form a square LED 2B chip having a size of about 350 μm × about 350 μm.

When an operation current of 20 mA was applied to the top electrode 106 and the bottom electrode 107 in a forward direction, light having a central emission wavelength of about 440 nm was emitted from the LED chip. Since the atomic concentration of silicon in the light-emitting layer 104 was controlled to be equal to that of silicon in the first or the second boron-phosphide-based semiconductor layer 103 or 105 serving as a cladding layer, variation in the atomic concentration of silicon in the light-emitting layer 104, which occurs as a result of diffusion of silicon atoms between these layers, was suppressed. Therefore, the luminance of the LED 2B chip as measured using a typical integrating sphere was found to be about 10 mcd; i.e., the high emission intensity LED 2B was provided. Forward voltage (Vf) was measured on the basis of current-voltage (I-V) characteristics, and found to be about 3 V (forward current=20 mA). Reverse voltage was found to be 7 V (reverse current=10 μA). Therefore, the LED 2B exhibited excellent rectification characteristics and high breakdown voltage.

EFFECTS OF THE INVENTION

According to the present invention, a Group III-V semiconductor light-emitting layer containing a Group IV element at an atomic concentration suitable for attaining high emission intensity is provided on a single-crystal silicon substrate, and first and second boron-phosphide-based semiconductor layers containing a Group IV element and having different conduction types are provided so as to come in contact with the light-emitting layer, to thereby form a pn-junction-type hetero structure. Therefore, diffusion of the Group IV element from the light-emitting layer to the outside thereof can be suppressed, and the atomic concentration of the Group IV element in the light-emitting layer can be maintained at an optimized level for attaining high emission intensity, thereby producing a light-emitting device exhibiting high emission intensity.

According to the present invention, each of the first and the second boron-phosphide-based semiconductor layers which sandwich the light-emitting layer so as to form a hetero junction structure is formed of an electrically conductive semiconductor layer of first or second conduction type containing a Group IV element having an atomic concentration nearly equal to that of the Group IV element contained in the light-emitting layer. Therefore, diffusion of the Group IV element between the light-emitting layer and the first or the second boron-phosphide-based semiconductor layer, which is caused by the difference in the atomic concentration of the Group IV element between these layers, can be suppressed, and the atomic concentration of the Group IV element in the light-emitting layer can be maintained at an optimal level for attaining high emission intensity, thereby producing a light-emitting device exhibiting high emission intensity.

In addition, according to the present invention, each of the first and the second boron-phosphide-based semiconductor layers which sandwich the light-emitting layer so as to form a hetero junction structure is formed of an electrically conductive semiconductor layer of first or second conduction type containing a Group IV element which is the same as that incorporated as a dopant into the light-emitting layer. Therefore, diffusion of the Group IV element between the light-emitting layer and the first or the second boron-phosphide-based semiconductor layer, which is caused by the difference in the atomic concentration of the Group IV element between these layers, can be suppressed, and the atomic concentration of the Group IV element in the light-emitting layer can be maintained at an optimized level for attaining high emission intensity, thereby producing a light-emitting device exhibiting high emission intensity.

Further, according to the present invention, each of the first and the second boron-phosphide-based semiconductor layers which sandwich the light-emitting layer so as to form a hetero junction structure is formed of an electrically conductive semiconductor layer of first or second conduction type containing a Group IV element which is the same as that incorporated as a dopant into the light-emitting layer such that the atomic concentration of the Group IV element contained in the electrically conductive semiconductor layer is nearly equal to that of the Group IV element contained in the light-emitting layer. Therefore, diffusion of the Group IV element between the light-emitting layer and the first or the second boron-phosphide-based semiconductor layer, which is caused by the difference in the atomic concentration of the Group IV element between these layers, can be suppressed, and the atomic concentration of the Group IV element in the light-emitting layer can be maintained at an optimized level for attaining high emission intensity, thereby producing a light-emitting device exhibiting high emission intensity.

Moreover, according to the present invention, the light-emitting layer is provided on a boron-phosphide-based semiconductor layer of first or second conduction type in which the atomic concentration of the Group IV element is equal to or less than the concentration of phosphorus (P) atoms occupying boron (B) vacancies or the concentration of boron (B) atoms occupying phosphorus vacancies. Therefore, the light-emitting layer exhibits excellent surface flatness while maintaining its conduction type without performance of doping. Furthermore, an intricate doping process employing different dopants for forming light-emitting layers of different conduction types can be avoided, and a light-emitting device emitting light of high intensity can be readily produced.

While the invention has been described in detail and with reference to specific embodiments thereof, it will be apparent to one skilled in the art that various changes and modifications can be made therein without departing from the spirit and scope thereof.

This application is based on Japanese Patent Application No. P2002-47457 filed Feb. 25, 2002, the disclosure of which is incorporated herein by reference in its entirety.

What is claimed is:

1. A pn-junction-type boron-phosphide-based semiconductor light-emitting device comprising a single-crystal silicon (Si) substrate of first conduction type; a first boron-phosphide-based semiconductor layer of first conduction type formed of an undoped boron-phosphide-based semiconductor of first conduction type containing a Group IV element provided on the substrate; a light-emitting layer formed of a Group III-V semiconductor layer of first or second conduction type which is doped with an element belonging to Group IV of the periodic table provided on the first boron-phosphide-based semiconductor layer, and a second boron-phosphide-based semiconductor layer of second conduction type formed of a boron-phosphide-based semiconductor layer of second conduction type containing a Group IV element provided on the light-emitting layer, wherein the first boron-phosphide-based semiconductor layer, the light-emitting layer, and the second boron-phosphide-based semiconductor layer form a pn-junction-type hetero structure, and wherein said second conduction type is opposite said first conduction type.

2. The pn-junction-type boron-phosphide-based semiconductor light-emitting device as claimed in claim 1, wherein the first boron-phosphide-based semiconductor layer contains the same Group IV element as the light-emitting layer.

3. The pn-junction-type boron-phosphide-based semiconductor light-emitting device as claimed in claim 1, wherein the first boron-phosphide-based semiconductor layer contains the Group IV element contained in an atomic concentration of 70% to 130% to that of the Group IV element contained in the light-emitting layer.

4. The pn-junction-type boron-phosphide-based semiconductor light-emitting device as claimed in claim 1, wherein the Group IV element contained in the first boron-phosphide-based semiconductor layer and the light-emitting layer is silicon (Si).

5. The pn-junction-type boron-phosphide-based semiconductor light-emitting device as claimed in claim 1, wherein the second boron-phosphide-based semiconductor layer is formed of an undoped boron-phosphide-based semiconductor layer of second conduction type.

6. The pn-junction-type boron-phosphide-based semiconductor light-emitting device as claimed in claim 1, wherein the second boron-phosphide-based semiconductor layer is formed of a boron-phosphide-based semiconductor layer of second conduction type doped with a Group IV element.

7. The pn-junction-type boron-phosphide-based semiconductor light-emitting device as claimed in claim 1, wherein the second boron-phosphide-based semiconductor layer contains the same Group IV element as the light-emitting layer.

8. The pn-junction-type boron-phosphide-based semiconductor light-emitting device according to claim 1, wherein the second boron-phosphide-based semiconductor layer contains the Group IV element in an atomic concentration of 70% to 130% to that of the Group IV element contained in the light-emitting layer.

9. The pn-junction-type boron-phosphide-based semiconductor light-emitting device as claimed in claim 1, wherein the Group IV element contained in the second boron-phosphide-based semiconductor layer and the light-emitting layer is silicon (Si).

10. The pn-junction-type boron-phosphide-based semiconductor light-emitting device as claimed in claim 4, wherein the first boron-phosphide-based semiconductor layer contains silicon in an atomic concentration equal to or less than a concentration of phosphorus atoms occupying boron vacancies or a concentration of boron atoms occupying phosphorus vacancies.

11. The pn-junction-type boron-phosphide-based semiconductor light-emitting device as claimed in claim 9, wherein the second boron-phosphide-based semiconductor layer contains silicon in an atomic concentration equal to or less than a concentration of phosphorus atoms occupying boron vacancies or a concentration of boron atoms occupying phosphorus vacancies.

12. A method for producing a pn-junction-type boron-phosphide-based semiconductor light-emitting device comprising a single-crystal silicon (Si) substrate of first conduction type; a first boron-phosphide-based semiconductor layer of first conduction type formed of an undoped boron-phosphide-based semiconductor of first conduction type containing a Group IV element provided on the substrate; a light-emitting layer formed of a Group II-V semiconductor layer of first or second conduction type which is doped with an element belonging to Group IV of the periodic table provided on the first boron-phosphide-based semiconductor layer; and a second boron-phosphide-based semiconductor layer of second conduction type formed of a boron-phosphide-based semiconductor layer of second conduction type containing a Group IV element is provided on the light-emitting layer, wherein the first boron-phosphide-based semiconductor layer, the light-emitting layer, and the second boron-phosphide-based semiconductor layer form a pn-junction-type hetero structure, and wherein said second conduction type is opposite said first conduction type, which method comprises providing a p-type single crystal silicon (Si) substrate;

forming a p-type boron-phosphide-based semiconductor layer at 1,000 to 1,200° C. through an MOCVD method on the substrate, forming a light-emitting layer on the p-type boron-phosphide based semiconductor layer; and forming an n-type boron-phosphide-based semiconductor layer at 750 to 950° C. through an MOCVD method on the light-emitting layer.

* * * * *